(12) United States Patent
Hong et al.

(10) Patent No.: US 11,221,523 B2
(45) Date of Patent: Jan. 11, 2022

(54) LIQUID CRYSTAL DISPLAY AND MANUFACTURING METHOD THEREOF

(71) Applicant: Samsung Display Co., Ltd., Yongin-Si (KR)

(72) Inventors: Ki Pyo Hong, Hwaseong-si (KR); Wan Namgung, Asan-si (KR); Seung-Kyu Lee, Cheonan-si (KR); Hyun Seong Kang, Cheonan-si (KR); Byeong Jae Ahn, Asan-si (KR)

(73) Assignee: Samsung Display Co., Ltd.

( * ) Notice: Subject to any disclaimer, the term of this patent is extended or adjusted under 35 U.S.C. 154(b) by 246 days.

(21) Appl. No.: 16/435,124

(22) Filed: Jun. 7, 2019

(65) Prior Publication Data

US 2020/0142228 A1 May 7, 2020

(30) Foreign Application Priority Data

Nov. 5, 2018 (KR) .......................... 10-2018-0134496

(51) Int. Cl.
| | |
|---|---|
| G02F 1/1368 | (2006.01) |
| G02F 1/1343 | (2006.01) |
| G02F 1/01 | (2006.01) |
| G02F 1/1362 | (2006.01) |
| G02F 1/133 | (2006.01) |

(52) U.S. Cl.
CPC .......... *G02F 1/1343* (2013.01); *G02F 1/0123* (2013.01); *G02F 1/13306* (2013.01); *G02F 1/136286* (2013.01)

(58) Field of Classification Search
None
See application file for complete search history.

(56) References Cited

U.S. PATENT DOCUMENTS

| | | | | |
|---|---|---|---|---|
| 2002/0057393 | A1* | 5/2002 | Park .................... | H01L 27/12 349/43 |
| 2005/0173762 | A1* | 8/2005 | Ohishi .............. | H01L 29/78696 257/347 |

(Continued)

FOREIGN PATENT DOCUMENTS

| | | |
|---|---|---|
| KR | 10-1994-0015588 A | 7/1994 |
| KR | 10-0552283 B1 | 6/2006 |
| KR | 10-2008-0048936 A | 6/2008 |

(Continued)

*Primary Examiner* — Thanh Nhan P Nguyen
(74) *Attorney, Agent, or Firm* — Innovation Counsel LLP

(57) ABSTRACT

A liquid crystal display includes: a gate line connected to a gate electrode; a semiconductor layer disposed on the gate line and including silicon; an ohmic contact layer disposed on the semiconductor layer; and a data conductor disposed on the ohmic contact layer. The semiconductor layer includes a source region, a drain region, and a channel region disposed between the source region and the drain region. The data conductor includes a data line transmitting a data signal, a source electrode corresponding to the source region, and a drain electrode corresponding to the drain region. A channel step of the semiconductor layer is a height difference between an upper surface in the source region or the drain region and an upper surface in the channel region. The upper surface in the source region or the drain region has a maximum height of the semiconductor layer.

12 Claims, 18 Drawing Sheets

(56) References Cited

U.S. PATENT DOCUMENTS

2016/0377928 A1* 12/2016 Park .......................... G03F 1/36
349/46
2016/0377930 A1* 12/2016 Park ................. G02F 1/134309
349/43

FOREIGN PATENT DOCUMENTS

KR         10-1293155 A      8/2013
KR    10-2015-0051531 A      5/2015

* cited by examiner

LIQUID CRYSTAL DISPLAY AND MANUFACTURING METHOD THEREOF

CROSS-REFERENCE TO RELATED APPLICATION

This application claims priority to and the benefit of Korean Patent Application No. 10-2018-0134496 filed in the Korean Intellectual Property Office on Nov. 5, 2018, the disclosure of which is incorporated herein by reference in its entirety.

BACKGROUND

(a) Technical Field

The present disclosure relates to a liquid crystal display and a manufacturing method thereof.

(b) Description of the Related Art

A liquid crystal display (LCD) is the most widely used among various types of flat panel displays. The liquid crystal display includes two display panels that are provided with field generating electrodes such as pixel electrodes and a common electrode, and a liquid crystal layer that is interposed therebetween. The liquid crystal display displays an image using a plurality of pixels. In each pixel, different voltages are applied to the corresponding pixel electrode and the common electrode, and an electric field is generated therebetween. The electric field determines a direction of liquid crystal molecules included in the liquid crystal layer and controls polarization of incidence light, to display an image.

As the liquid crystal displays become larger and of higher quality, it is required to improve electrical characteristics of a thin film transistor that drives liquid crystal layer. In a process for forming a thin film transistor, a semiconductor layer of the thin film transistor may be etched to have an inclined surface or a protruded portion and it may result in deterioration of a display quality.

The above information disclosed in this Background section is only for enhancement of understanding of the background of the present disclosure, and therefore it may contain information that does not form a prior art that is already known to a person of ordinary skill in the art.

SUMMARY

The exemplary embodiments of the present disclosure provides a liquid crystal display and a method manufacturing the same. The liquid crystal display reduces a protruded part of a semiconductor pattern, and it can reduce or prevent a waterfall phenomenon, and thereby improving a display quality of the display device. In addition, the liquid crystal display may prevent occurrence of a leakage current by smoothing a channel step of a semiconductor layer and may further prevent or reduce occurrence of a washed-out color defect by increasing a difference between a washed-out color voltage and a reference voltage.

According to one embodiment, the liquid crystal display according to an exemplary embodiment of the present disclosure includes: a gate line connected to a gate electrode; a semiconductor layer disposed on the gate line and including silicon; an ohmic contact layer disposed on the semiconductor layer; and a data conductor disposed on the ohmic contact layer, wherein the semiconductor layer includes a source region, a drain region, and a channel region that is disposed between the source region and the drain region, wherein the data conductor includes a data line transmitting a data signal, a source electrode corresponding to the source region, and a drain electrode corresponding to the drain region, wherein a channel step of the semiconductor layer is greater than 0 Å and equal to or less than 50 Å, wherein the channel step is a height difference of an upper surface in the source region or the drain region and an upper surface in the channel region, and wherein the upper surface in the source region or the drain region has a maximum height of the semiconductor layer.

The semiconductor layer and the ohmic contact layer may include a protruded part that does not overlap the data conductor in a region except for the channel region, and a width of the protruded part may be equal to or less than 1.3 μm.

The semiconductor layer and the ohmic contact layer may have a same plane shape as the data conductor except for the channel region and the protruded part.

The ohmic contact layer may have a thickness greater than 0 Å and equal to or less than 200 Å.

The semiconductor layer may have a thickness between 800 Å and 900 Å.

A ratio of the channel step to the thickness of the semiconductor layer may be greater than 0 and equal to or less than 0.056.

A difference of a washed-out color voltage Vss causing a washed-out color defect and a reference voltage Voff may be greater than 2.5 V and less than 6 V, and the washed-out color defect may occur when the washed-out color voltage is smaller than the reference voltage.

The width of the protruded part may be 11.5 to 16.3 times greater than a sum of a thickness of the semiconductor layer and a thickness of the ohmic contact layer.

The liquid crystal display may further include: a first switching element and a second switching element that are connected to the gate line and the data line; a third switching element connected to the gate line, the second switching element, and the reference voltage line; a first sub-pixel electrode connected to the first switching element; and a second sub-pixel electrode connected to the second switching element and the third switching element.

The data line and the reference voltage line may be disposed on a same layer.

A storage voltage line transmitting a predetermined voltage may be disposed on a same layer as the gate line, and a first storage electrode overlapping the first sub-pixel electrode and a second storage electrode overlapping the second sub-pixel electrode may extend from the storage voltage line.

The first storage electrode and the second storage electrode may overlap a longitudinal stem of the first sub-pixel electrode or a longitudinal stem of the second sub-pixel electrode.

A manufacturing method of a liquid crystal display according to an exemplary embodiment of the present disclosure includes: forming a gate line on a substrate; stacking a first silicon layer, a second silicon layer, and a metal layer on the gate line; etching the metal layer by using a first photosensitive film pattern as a first mask to form a data line and a data metal layer; etching the first silicon layer and the second silicon layer using the first photosensitive film pattern to form an ohmic contact layer and a semiconductor layer; wet-etching the data metal layer corresponding to a channel region of the semiconductor layer by using a second photosensitive film pattern as a second mask to form a source electrode and a drain electrode of a switching element; etching the ohmic contact layer by using the second photosensitive film pattern to expose the channel region of the semiconductor layer; and dry-etching the channel region of the semiconductor layer by using the second photosensitive film pattern, wherein a thickness of the semiconductor layer that is etched by the dry-etching is greater than 0 Å and equal to or less than 50 Å.

An etching gas used in the dry etching may not include chlorine (Cl).

A sum of an etched thickness of the ohmic contact layer and an etched thickness of the semiconductor layer may be greater than 0 Å and equal to or less than 200 Å.

The ohmic contact layer may have a thickness greater than 0 Å and equal to or less than 150 Å.

The first photosensitive film pattern may be subjected to an etch-back process to form the second photosensitive film pattern before or after forming the ohmic contact layer and the semiconductor layer.

In a step of forming the ohmic contact layer and the semiconductor layer, a protruded part where the ohmic contact layer and the semiconductor layer are not in contact with the data line or the data metal layer may be formed, and a width of the protruded part may be equal to or less than 1.3 µm.

The method may further include, after dry-etching the semiconductor layer, removing the second photosensitive film pattern, forming a passivation layer including a contact hole that exposes a part of the drain electrode, and forming a pixel electrode connected to the drain electrode through the contact hole on the passivation layer.

The semiconductor layer may have a thickness between 800 Δ and 900 Δ.

According to the exemplary embodiments, as the width of the protruded part of the semiconductor pattern is reduced, a waterfall phenomenon may be reduced or prevented and, a display quality of the display device may be improved. In addition, as the channel step of the semiconductor layer is minimized, a leakage current may be reduced or prevented, and stability from a washed-out color defect may be secured, thereby improving the display quality of the liquid crystal display.

DETAILED DESCRIPTION OF THE EMBODIMENTS

Figure 1:
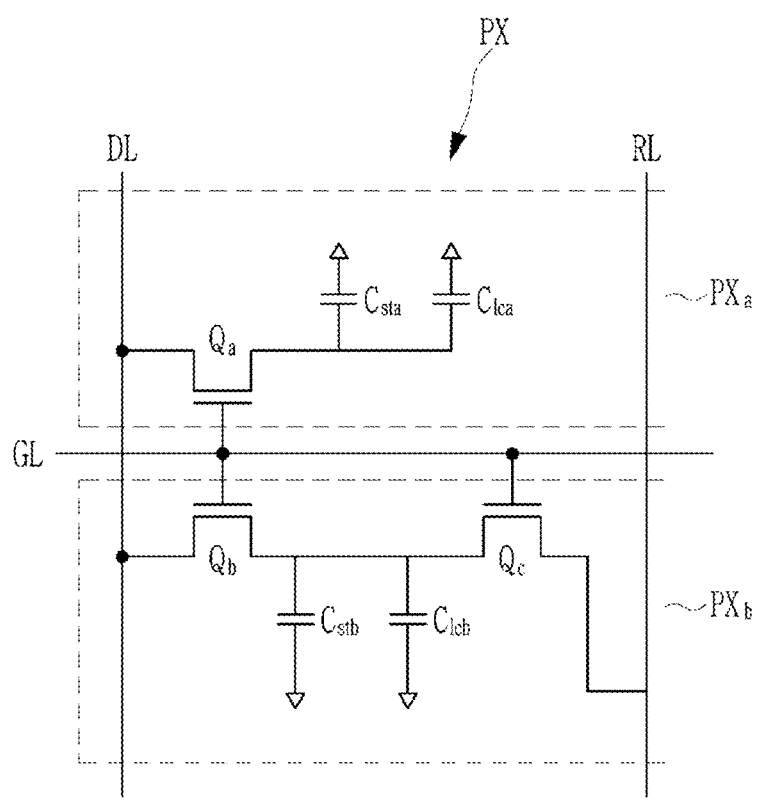
FIG. 1 is an equivalent circuit diagram of a liquid crystal display according to an exemplary embodiment.

The present disclosure will be described more fully hereinafter with reference to the accompanying drawings, in which exemplary embodiments of the present disclosure are shown. As those skilled in the art would realize, the described embodiments may be modified in various different ways, without departing from the spirit or scope of the present disclosure.

In describing the present disclosure, parts that are not related to the description may be omitted. Like reference numerals generally designate like elements throughout the specification.

In addition, the size and thickness of each configuration shown in the drawings are arbitrarily shown for better understanding and ease of description, but the present disclosure is not limited thereto. In the drawings, the thickness of layers, films, panels, regions, etc., may be exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or one or more intervening elements may also be present. In contrast, when an element is referred to as being "directly on" another element, there may be no intervening elements present. Further, in the specification, the word "on" or "above" means positioned on or below an object portion, and does not necessarily mean positioned on an upper side of the object portion based on a gravitational direction.

In addition, unless explicitly described to the contrary, the word "comprise" and variations such as "comprises," "comprising," etc. will be understood to imply an inclusion of stated elements but not an exclusion of any other elements.

Further, throughout the specification, "on a plane" refers to an orientation or a configuration in which a target part is viewed from the top, and "on a cross-section" refers to an orientation or a configuration in which a target part is vertically cross-cut and viewed from a side.

An exemplary embodiment of the present disclosure will now be described with reference to accompanying drawings.

First, a signal line of a liquid crystal display, an arrangement of a pixel, and a driving method thereof according to an exemplary embodiment of the present disclosure are described with reference to FIG. 1. FIG. 1 is an equivalent circuit diagram of a liquid crystal display according to an exemplary embodiment.

Referring to FIG. 1, a pixel PX of a liquid crystal display according to an exemplary embodiment includes a plurality of signal lines including a gate line GL transmitting a gate signal, a data line DL transmitting a data signal, and a divided reference voltage line RL transmitting a divided reference voltage. The pixel PX further includes a first switching element Qa, a second switching element Qb, a third switching element Qc, a first liquid crystal capacitor Clca, a second liquid crystal capacitor Clcb, a first storage capacitor Csta, and a second storage capacitor Cstb that are connected to the plurality of signal lines. The pixel PX may include a first sub-pixel PXa and a second sub-pixel PXa. The first sub-pixel PXa may include the first switching element Qa, the first storage capacitor Csta, and the first liquid crystal capacitor Clca, and the second sub-pixel PXb may include the second switching element Qb, the second storage capacitor Cstb, the second liquid crystal capacitor Clcb, and the third switching element Qc.

The first switching element Qa and the second switching element Qb are respectively connected to the gate line GL and the data line DL, and the third switching element Qc is connected to the gate line GL, the divided reference voltage line RL, and an output terminal of the second liquid crystal capacitor Clcb.

Each of the first switching element Qa and the second switching element Qb may be a three-terminal element such as a thin film transistor. For example, each of the first switching element Qa and the second switching element Qb includes a control terminal that is connected to the gate line GL and an input terminal that is connected to the data line DL. An output terminal of the first switching element Qa is connected to the first liquid crystal capacitor Clca, and an output terminal of the second switching element Qb is connected to the second liquid crystal capacitor Clcb and an input terminal of the third switching element Qc.

The third switching element Qc may also be a three-terminal element such as a thin film transistor, and includes a control terminal that is connected to the gate line GL, an input terminal that is connected to the second liquid crystal capacitor Clcb, and an output terminal that is connected to the divided reference voltage line RL.

If a gate-on signal is applied to the gate line GL, the first switching element Qa, the second switching element Qb, and the third switching element Qc that are connected thereto are turned on. Accordingly, a data voltage applied to the data line DL is applied to a first sub-pixel electrode (191a shown in FIG. 2) and a second sub-pixel electrode (191b shown in FIG. 2) through the turned-on first switching element Qa and second switching element Qb. In this case, the data voltage applied to the first sub-pixel electrode and the second sub-pixel electrode are the same as each other, and the first liquid crystal capacitor Clca and the second liquid crystal capacitor Clcb are charged with the same value by a difference between a common voltage and the data voltage.

Simultaneously, the voltage charged to the second liquid crystal capacitor Clcb is divided through the turned-on third switching element Qc. Thus, the voltage value charged to the second liquid crystal capacitor Clcb decreases by the difference between the common voltage and the divided reference voltage. That is, the voltage charged to the first liquid crystal capacitor Clca is higher than the voltage charged to the second liquid crystal capacitor Clcb.

As described above, a charging voltage of the second liquid crystal capacitor Clcb may be adjusted by controlling the third switching element Qc, the reference voltage, and the like, and luminance of the two sub-pixels PXa and PXb of the pixel PX may be differentiated. By properly adjusting the voltages that charge the first liquid crystal capacitor Clca and the second liquid crystal capacitor Clcb, an image viewed from a side can be closely matched to the image viewed from the front, thereby improving lateral visibility of a display device.

The first storage capacitor Csta has a first terminal that is connected to the output terminal of the first switching element Qa, and a second terminal that is connected to a first storage electrode of a storage voltage line (not shown). In addition, the second storage capacitor Cstb has a first terminal that is connected to the output terminal of the second switching element Qb and a second terminal that is connected to a second storage electrode of the storage voltage line (not shown).

The first storage capacitor Csta and the second storage capacitor Cstb serve to enhance and maintain a storage capacity of the first liquid crystal capacitor Clca and the second liquid crystal capacitor Clcb.

Figure 2:
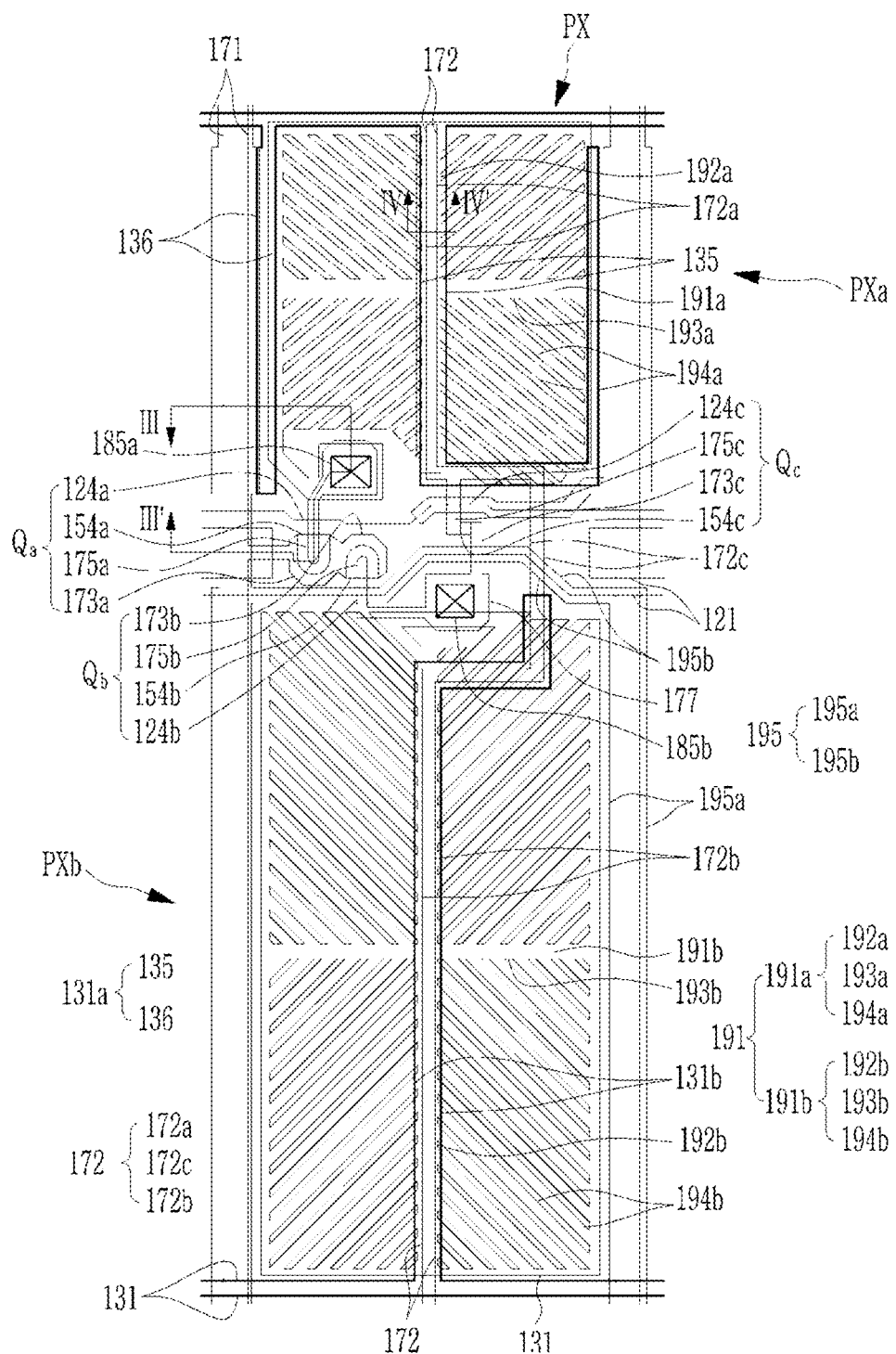
FIG. 2 is a layout view of a liquid crystal display according to an exemplary embodiment.
Figure 3:
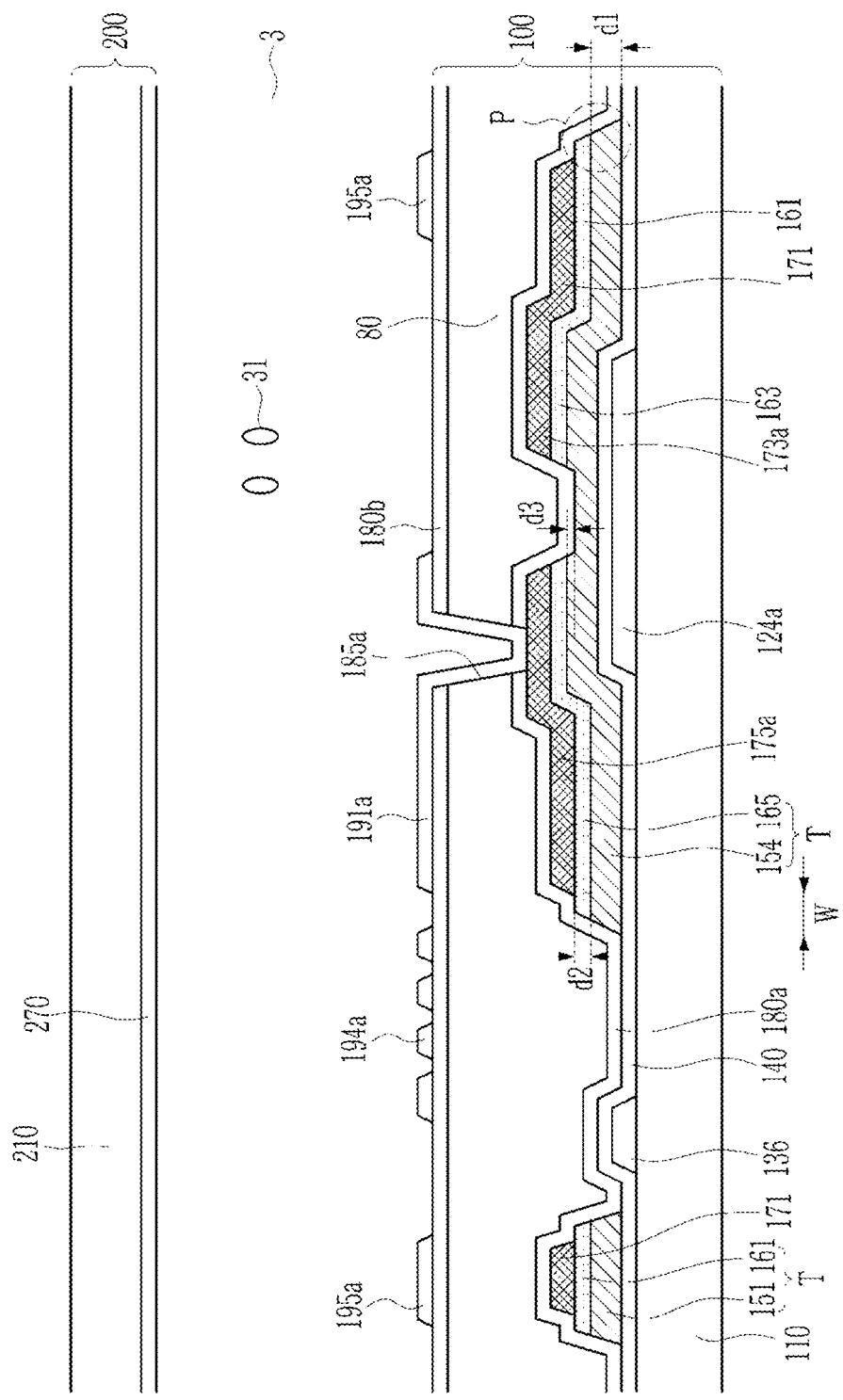
FIG. 3 is a cross-sectional view of the liquid crystal display of FIG. 2 taken along a line III-III'.
Figure 4:
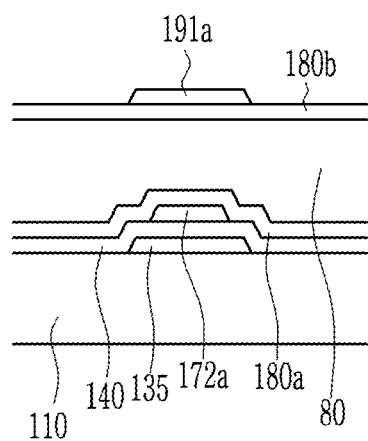
FIG. 4 is a cross-sectional view of the liquid crystal display of FIG. 2 taken along a line IV-IV'.

Next, the display device according to an exemplary embodiment is described with reference to FIG. 2 to FIG. 4. FIG. 2 is a layout view of a liquid crystal display according to an exemplary embodiment, FIG. 3 is a cross-sectional view of the liquid crystal display of FIG. 2 taken along a line III-III', and FIG. 4 is a cross-sectional view of the liquid crystal display of FIG. 2 taken along a line IV-IV'.

The liquid crystal display according to an exemplary embodiment includes a lower panel 100 and an upper panel 200 facing to each other, and a liquid crystal layer 3 interposed between two display panels 100 and 200.

First, the lower panel 100 is described.

The lower panel 100 includes a lower substrate 110, a data line 171, a gate line 121 crossing the data line 171, switching elements (e.g., thin film transistors) Qa, Qb, and Qc that are connected to the data line 171 and the gate line 121, an organic layer 80, a first passivation layer 180a, a second passivation layer 180b, a pixel electrode 191, and a shielding electrode 195.

A gate conductor is formed on the lower substrate 110 that is made of a transparent glass or plastic. The gate conductor includes a plurality of gate lines 121 and a plurality of storage voltage lines 131.

The gate line 121 transmits the gate signal and includes a first gate electrode 124a, a second gate electrode 124b, and a third gate electrode 124c.

The storage voltage line 131 may be disposed in a horizontal direction parallel to the gate line 121. In one embodiment, the storage voltage line 131 may be disposed above and below an edge of the pixel PX. More specifically, the storage voltage line 131 may be disposed at an upper end of the first sub-pixel PXa and a lower end of the second sub-pixel PXb. A first storage electrode 131a and a second storage electrode 131b respectively extend from the storage voltage line 131. The storage voltage line 131 transmits a predetermined voltage such as a common voltage Vcom.

The first storage electrode 131a is disposed in the first sub-pixel PXa and extends from the storage voltage line 131 that is disposed at the upper end of the first sub-pixel PXa. The first storage electrode 131a includes a longitudinal part 136 and a curved part 135.

The curved part 135 of the first storage electrode 131a extends downwardly from the first storage line 131 in a vertical direction overlapping a center portion of a longitudinal stem 192a of the first sub-pixel electrode 191a, extends to the right in the horizontal direction parallel to the first storage line 131 overlapping a part of a minute stem 194a of a right lower end of the first sub-pixel electrode 191a, and extends upwardly in the vertical direction toward the first storage line 131 overlapping a right portion of the longitudinal stem 192a of the first sub-pixel electrode 191a. That is, the curved part 135 extends from the storage voltage line 131 and is curved in a U-shape surrounding three sides of the first sub-pixel electrode 191a.

The longitudinal part 136 of the first storage electrode 131a extends downwardly from the storage voltage line 131 in the vertical direction overlapping a left portion of the longitudinal stem 192a of the first sub-pixel electrode 191a. The second storage electrode 131b is disposed in the second sub-pixel electrode 191b and extends from the storage voltage line 131 that is disposed at the lower end of the second sub-pixel electrode 191b.

The second storage electrode 131b extends upwardly in the vertical direction overlapping a center portion of a longitudinal stem 192b of the second sub-pixel electrode 191b, extends to the right in the horizontal direction overlapping a part of a minute stem 194b of a right upper end of the second sub-pixel electrode 191b, and again extends upwardly in the vertical direction while overlapping a part of the minute stem 194b.

It is understood that the extended shapes of the first storage electrode 131a and the second storage electrode 132b are not limited to the present example shown in FIG. 2, and various other shapes of the first storage electrode 131a and the second storage electrode 132b are possible based on the configuration of the pixel PX (e.g., placement of the switching elements Qa, Qb, and Qc) without deviating from the scope of the present disclosure. For example, the first storage electrode 131a may extend from the first storage line 131 that is disposed at the upper end of the first sub-pixel electrode 191a downwardly, to the left, and upwardly, and the second storage electrode 131b extends from the first storage line 131 that is disposed at the lower end of the second sub-pixel electrode 191b upwardly, to the left, and upwardly.

In addition, the second storage electrode 131b is formed to overlap a reference voltage line 172, which will be described later.

According to one embodiment, the storage voltage line 131 may be formed to be wider than the reference voltage line 172.

A gate insulating layer 140 is disposed on the gate line 121 and the storage voltage line 131.

A semiconductor layer (151 and 154) is formed on the gate insulating layer 140. The semiconductor layer (151 and 154) includes a linear semiconductor layer 151 overlapping the data line 171 and a semiconductor layer 154 forming a plurality of thin film transistors. The semiconductor layer 154 includes a first semiconductor 154a, a second semiconductor 154b, and a third semiconductor 154c. The semiconductor layer (151 and 154) includes a source region and a drain region that are doped with an impurity, and a channel region that is not doped with the impurity. The source region and the drain region respectively correspond to source electrodes 173a, 173b, and 173c and drain electrodes 175a, 175b, and 175c, which will be described later.

The semiconductor layer (151 and 154) may include an amorphous silicon (a-Si), a polysilicon (a polycrystalline silicon; poly-Si), or the like.

A first thickness d1 of the semiconductor layer 151 and 154 may be between 800 Å and 900 Å, for example, less than 850 Å, however the range of the first thickness d1 is not limited thereto.

Ohmic contact layers 161 and 165 are disposed on the semiconductor layer (151 and 154). The ohmic contact layer 165 may include a stepped part 163. A second thickness d2 of the ohmic contact layers 161 and 165 may be greater than 0 Å and equal to or less than 200 Å, for example, greater than 0 Å and less than 150 Å, however the range of the second thickness d2 is not limited thereto.

A data conductor is disposed on the ohmic contact layers 161 and 165 and the gate insulating layer 140. The data conductor includes a plurality of data lines 171 including a first source electrode 173a and a second source electrode 173b, the reference voltage line 172 including a third drain electrode 175c, a first drain electrode 175a, a second drain electrode 175b, and a third source electrode 173c. The first source electrode 173a and the second source electrode 173b may be connected to the data line 171. The third drain electrode 175c may be connected to the reference voltage line 172.

The patterns of the semiconductor layer 151 and the ohmic contact layer 161, and the semiconductor layer 154 and the ohmic contact layers 161 and 165, are respectively referred to as a semiconductor pattern T. The semiconductor pattern T includes a protruded part P that does not overlap the data conductor (171, 173c, 175a, 175b, and 175c) at an edge of the data conductor (171, 173c, 175a, 175b, and 175c). The protruded part P may be formed by an isotropic characteristic of a wet etching or an etch-back process of a photosensitive film pattern in a process of etching the data conductor (171, 173c, 175a, 175b, and 175c) and the semiconductor pattern T using the same mask. This is described in detail in FIG. 5 to FIG. 13.

In this case, the semiconductor pattern T may be exposed by an external light supplied from an external light source (e.g., a backlight unit), and/or the like by the protruded part P. In particular, when the semiconductor layers 151 and 154 are made of an amorphous silicon (a-Si), electrical conductivity may change depending on the intensity of the external light. Although conductivity may be improved, a parasitic capacitance may be generated causing a change in the existing capacitance, and a problem that a display screen is recognized as partially bright and partially dark may occur. The phenomenon in which a bright and dark stripe appears on the display screen as if it flows up and down according to the brightness difference is referred to as a waterfall phenomenon.

According to an exemplary embodiment, the semiconductor pattern T may be prevented from being exposed to an external light by reducing a width w of the protruded part P of the semiconductor pattern T. Accordingly, a variation of a width of the electrical conductivity of the semiconductor layer 154 may be reduced, thereby reducing or preventing a variation of the capacitance. As a result, a defect such as the waterfall phenomenon that may be reduced or prevented. According to the liquid crystal display of an exemplary embodiment, the width w of the protruded part P may be greater than 0 μm and equal to or less than 1.3 μm.

On the other hand, the data conductor (171, 173c, 175a, 175b, and 175c) may overlap a plurality of underlying layers including the semiconductor layer (151 and 154) and the ohmic contact layers 161 and 165. Specifically, except for the protruded part P of the semiconductor pattern T that has the width w, the semiconductor pattern T may have substantially the same plane shape as the data line 171 and a data metal layer 174 (shown in FIGS. 7, 8, and 9) that is disposed on the data line 171. This is because the data conductor (171, 173c, 175a, 175b, and 175c) and the semiconductor pattern T are etched by using the same photosensitive film pattern (not shown) as a mask. This is described in detail in FIG. 5 to FIG. 13.

The reference voltage line 172 includes a first longitudinal part 172a, a second longitudinal part 172b, and a curved part 172c. The first longitudinal part 172a and the second longitudinal part 172b are disposed to respectively overlap the longitudinal stems 192a and 192b of the first sub-pixel electrode 191a and the second sub-pixel electrode 191b. In this case, the first and second longitudinal parts 172a and 172b may have a width that is narrower than that of the longitudinal stems 192a and 192b of the sub-pixel electrodes 191a and 191b.

The curved part 172c of the reference voltage line 172 is connected to the third drain electrode 175c, respectively extends from the longitudinal parts 172a and 172b in the horizontal direction overlapping a part of the minute stems 194a and 194b of the sub-pixel electrodes 191a and 191b, and extends vertically to connect the first and second longitudinal parts 172a and 172b.

According to one embodiment, the longitudinal parts 172a and 172b of the reference voltage line 172 are disposed to overlap the storage voltage line 131. The first longitudinal part 172a and a transverse part of the curved part 172c are disposed to overlap the curved part 135 of the first storage electrode 131a. The second longitudinal part 172b, the transverse part of the curved part 172c, and a longitudinal part of the curved part 172c are disposed to overlap the second storage electrode 131b.

In this case, a width of the reference voltage line 172 may be narrower than that of the storage voltage line 131.

The first source electrode 173a and the first drain electrode 175a form the first switching element Qa (or a first thin film transistor (TFT)) along with the first semiconductor 154a, and a channel of the first switching element Qa is formed in the first semiconductor 154a between the first source electrode 173a and the first drain electrode 175a.

Similarly, the second gate electrode 124b, the second source electrode 173b, and the second drain electrode 175b form the second switching element Qb (or a second thin film transistor) along with the second semiconductor 154b, and a channel of the second switching element Qb is formed in the second semiconductor 154b between the second source electrode 173b and the second drain electrode 175b.

Further, the third gate electrode 124c, the third source electrode 173c, and the third drain electrode 175c form the third switching element Qc (or a divided switching element, a third thin film transistor) along with the third semiconductor 154c, and a channel of the third switching element Qc is formed in the third semiconductor 154c between the third source electrode 173c and the third drain electrode 175c. In this case, the second drain electrode 175b is connected to the third source electrode 173c through a widened extension part 177.

To form the channels of the switching elements Qa, Qb, and Qc, the semiconductor layer 154, the ohmic contact layers 161 and 165, and the data conductor (171, 173c, 175a, 175b, and 175c) are patterned. In the channel region, the data conductor (171, 173c, 175a, 175b, and 175c) and the ohmic contact layer 165 are entirely etched, and the semiconductor layer 154 is etched by the third thickness d3 from the upper side. As a result, a channel step is formed in the channel region of the semiconductor layer 154. The channel step corresponds to a height difference between the upper surface in the source region (or the drain region) of the semiconductor layer 154 and the upper surface in the channel region.

Referring to FIG. 3, the height difference of the semiconductor layer 154 is greater than 0 Å and equal to or less than 50 Å as a maximum thickness that the semiconductor layer 154 is etched for the channel formation of the switching elements Qa, Qb, and Qc is formed to be equal to or less than 50 Å. In other words, the channel step of the semiconductor layer 154 is greater than 0 Å and equal to or less than 50 Å.

As described above, the first thickness d1 of the semiconductor layers 151 and 154 may be between 800 Å and 900 Å. Accordingly, a ratio (d3/d1) of the third thickness d3 of the channel step of the semiconductor layer 154 with respect to the first thickness d1 of the semiconductor layer (151 and 154) may be less than 0.07, and in some embodiments, may have a value of less than 0.056. As an example, when the third thickness d3 of the channel step of the semiconductor layer 154 is 50 Å and the first thickness d1 is 900 Å, the ratio (d3/d1) has a small value of about 0.056 indicating that the channel step is small.

When the channel step of the switching elements Qa, Qb, and Qc is large, a large amount of a leakage current may flow. When a large amount of the leakage current flows, a switching element that is turned off may behave as if it is turned on, which may result in a washed-out color defect in which the color is display as being distorted.

According to an exemplary embodiment, the channel step of the semiconductor layer 154 is reduced or minimized so that a cross-section of the semiconductor layer 154 in the channel region is formed to be substantially flat. Thus, by reducing or minimizing the channel step of the semiconductor layer 154, a leakage current may be prevented and occurrence of a washed-out color defect may be reduced or prevented, thereby improving an image quality of the display device.

The first thickness d1 that corresponds to the thickness of the semiconductor layer 154 may be between 800 Å and 900 Å, and the second thickness d2 that corresponds to the thickness of the ohmic contact layer 165 may be greater than 0 Å and equal to or less than 200 Å. Accordingly, a sum (d1+d2) of the thicknesses of the semiconductor layer 154 and the ohmic contact layer 165 may be greater than 800 Å and equal to or less than 1100 Å. As described above, since the width w of the protruded part P of the semiconductor pattern T is greater than 0 μm and equal to or less than 1.3 μm, a ratio (w/(d1+d2)) of the width w of the protruded part P with respect to the sum (d1+d2) of the thicknesses of the semiconductor layer 154 and the ohmic contact layer 165 may have a value between 10 and 17. In some embodiments, the ratio (w/(d1+d2)) may have a value between 11.5 and 16.3.

The ohmic contact layers 161 and 165 may have the second thickness d2 that is greater than 0 Å and equal to or less than 150 Å. Since the ohmic contact layer 165 is entirely etched to form the channels of the switching elements Qa, Qb, and Qc, the second thickness d2 of the etched ohmic contact layer 165 may be greater than 0 Å and equal to or less than 150 Å.

Accordingly, the sum of the second thickness d2 of the ohmic contact layers 161 and 165 that are etched to form the channels of the switching elements Qa, Qb, and Qc and the third thickness d3 of the etched semiconductor layer 154 may be greater than 0 Å and equal to or less than 200 Å. That is, by reducing or minimizing the thicknesses of the etched ohmic contact layers 161 and 165 and the semiconductor layer 154, the height difference of the upper surface of the semiconductor layer 154 in the channel region and the source (or the drain) region may be reduced or minimized, and the deterioration of the thin film transistor characteristic due to an inflow of impurities by the etching of the semiconductor layer 154 may be prevented.

The first passivation layer 180a may be disposed on the data conductor (171, 173c, 175a, 175b, and 175c) and parts of the semiconductors 154a, 154b, and 154c that are exposed. The first passivation layer 180a may include an inorganic insulator such as a silicon nitride or a silicon oxide, or an organic insulator. The first passivation layer 180a may prevent a pigment of the organic layer 80 from flowing into the parts of the semiconductors 154a, 154b, and 154c that are exposed.

The organic layer 80 may be disposed on the first passivation layer 180a. The organic layer 80 may be thicker than the first passivation layer 180a and may have a flat surface. The organic layer 80 may be a color filter. The organic layer 80 may extend in the vertical direction along two data lines 171 that are adjacent to each other.

The second passivation layer 180b may be disposed on the organic layer 80. The second passivation layer 180b may include an inorganic insulator or an organic insulator. In some embodiments, the second passivation layer 180b may be omitted. The second passivation layer 180b may include an inorganic insulating layer such as a silicon nitride or a silicon oxide. When the organic layer 80 is the color filter, the second passivation layer 180b prevents peeling of the color filter and suppresses contamination of the liquid crystal layer 3 by an organic material of a solvent that may inflow from the color filter, thereby preventing defects such as afterimages that may occur when an image is driven.

A first contact hole 185a and a second contact hole 185b are formed penetrating through the first passivation layer 180a, the organic layer 80, and the second passivation layer 180b and expose the first drain electrode 175a and the second drain electrode 175b.

A plurality of pixel electrodes 191 and the shielding electrode 195 are disposed on the second passivation layer 180b.

Each pixel electrode 191 includes the first sub-pixel electrode 191a and the second sub-pixel electrode 191b that are separated from each other via the gate line 121 and arranged to be adjacent to each other in the column direction with respect to the gate line 121. The pixel electrode 191 may include a transparent material such as indium tin oxide (ITO) and indium zinc oxide (IZO). The pixel electrode 191 may include a reflective metal material such as aluminum, silver, chromium, or an alloy thereof.

Each of the first sub-pixel electrode 191a and the second sub-pixel electrode 191b may have a quadrangular shape and include a cross stem including a transverse stem (e.g., 193a and 193b) and a longitudinal stem (e.g., 192a and 192b) and a plurality of minute stems (e.g., 194a and 194b) extending from the cross stem.

The first sub-pixel electrode 191a and the second sub-pixel electrode 191b are physically and electrically connected to the first drain electrode 175a and the second drain electrode 175b through the first contact hole 185a and the second contact hole 185b, thereby receiving a data voltage from the first drain electrode 175a and the second drain electrode 175b. In this case, the data voltage applied to the second drain electrode 175b is divided through the third source electrode 173c such that the voltage applied to the first sub-pixel electrode 191a is greater than the voltage applied to the second sub-pixel electrode 191b.

The first sub-pixel electrode 191a and the second sub-pixel electrode 191b to which the data voltage is applied generate an electric field together with a common electrode 270 disposed on the upper panel 200 to determine directions of liquid crystal molecules 31 included in the liquid crystal layer 3 between the pixel electrode 191 and the common electrode 270. Luminance of light passing through the liquid crystal layer 3 varies according to the determined directions of the liquid crystal molecules.

The first sub-pixel electrode 191a and the first storage electrode 131a overlap each other to form the first storage capacitor Csta, and the second sub-pixel electrode 191b and the second storage electrode 131b overlap each other to form the second storage capacitor Cstb.

The first storage electrode 131a and the second storage electrode 131b extending from the storage voltage line 131 form the storage capacitors Csta and Cstb by overlapping the first sub-pixel electrode 191a and the second sub-pixel electrode 191b and simultaneously serve to prevent light leakage that may occur between a pixel area adjacent thereto and between the pixel electrode 191 and the data line 171.

The shielding electrode 195 includes a longitudinal part 195a disposed in the vertical direction and a transverse part 195b disposed in the horizontal direction.

According to one embodiment, the shielding electrode 195 may be applied with the same voltage as the common electrode 270 that is disposed on an upper substrate 210. In this case, no electric field is generated between the shielding electrode 195 and the common electrode 270, and the orientation of the liquid crystal molecules 31 included in the liquid crystal layer 3 that is disposed between the shielding electrode 195 and the common electrode 270 may not be affected. For example, the liquid crystal layer 3 between the shielding electrode 195 and the common electrode 270 reveals black. In this case, the liquid crystal layer 3 itself may serve as a light blocking member (e.g., a black matrix, not shown).

The longitudinal part 195a of the shielding electrode 195 may be disposed to overlap the data line 171 in a direction parallel to the data line 171. The transverse part 195b of the shielding electrode 195 may extend from the longitudinal part 195a and be disposed between the first sub-pixel electrode 191a and the second sub-pixel electrode 191b. In this case, when the shielding electrode 195 is formed along the data line 171 as shown in FIG. 2, the light blocking member (not shown) may not be formed on the data line 171.

According to one embodiment, the shielding electrode 195 may not be separated in a pixel area but may be connected in the entire pixel area to form a single electrode.

Next, the upper panel 200 is described.

The common electrode 270 is formed on the upper substrate 210. An upper alignment layer (not shown) may be formed on the common electrode 270. The upper alignment layer may be a vertical alignment layer.

The liquid crystal layer 3 may have negative dielectric anisotropy. In this case, the liquid crystal molecules 31 of the liquid crystal layer 3 are oriented such that their long axes are perpendicular with respect to the surfaces of the two display panels 100 and 200 in the absence of an electric field.

The arrangement disposition type of the pixel area, the structure of the thin film transistor, and the shape of the pixel electrode described above are merely examples, and the present disclosure is not limited thereto and numerous variations are possible.

Next, the method manufacturing the liquid crystal display according to an exemplary embodiment is described with reference to FIG. 5 to FIG. 13 and FIG. 3. FIG. 5 to FIG. 13 are cross-sectional views sequentially showing a manufacturing method of a liquid crystal display according to an exemplary embodiment as a cross-sectional view taken along a line III-III' of FIG. 2.

In the following, description of the same constituent elements as those described above may be omitted, and only the added or characteristic portions will be described.

A first mask process is described with reference to FIG. 5.

Figure 5:
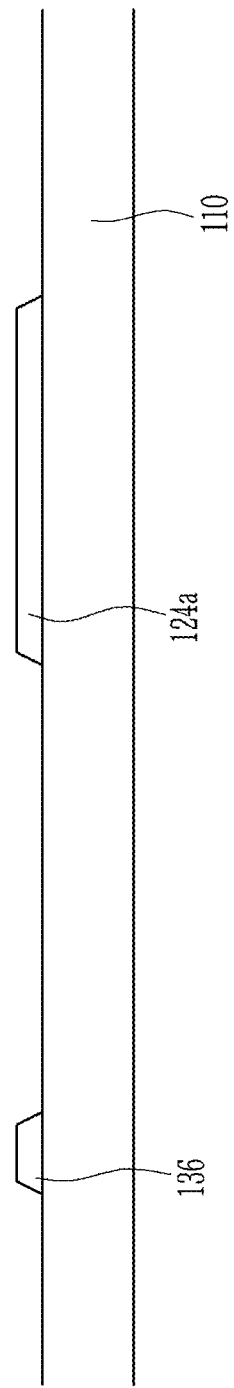
FIG. 5 to FIG. 13 are cross-sectional views sequentially showing a manufacturing method of a liquid crystal display according to an exemplary embodiment as a cross-sectional view taken along a line III-III' of FIG. 2.

Referring to FIG. 5, a gate conductive layer for forming a gate conductor is deposited on a lower substrate 110 that is made of transparent glass or plastic. The gate conductor may include a gate line 121 including a first gate electrode 124a and a storage voltage line 131 including a first storage electrode 131a and a second storage electrode 131b.

The gate conductive layer may be made of an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), titanium (Ti), and tantalum (Ta), but the present disclosure is not limited thereto.

After depositing the gate conductive layer, a photosensitive film (not shown) is deposited and patterned, and the gate conductive layer is etched by using the patterned photosensitive film (not shown) as a mask to form the gate conductor. This is referred to as a first mask process. FIG. 5 shows a partial cross-section of the first gate electrode 124a and the longitudinal part 136 of the first storage electrode 131a.

Next, a second mask process is described with reference to FIG. 6 to FIG. 11.

Figure 6:
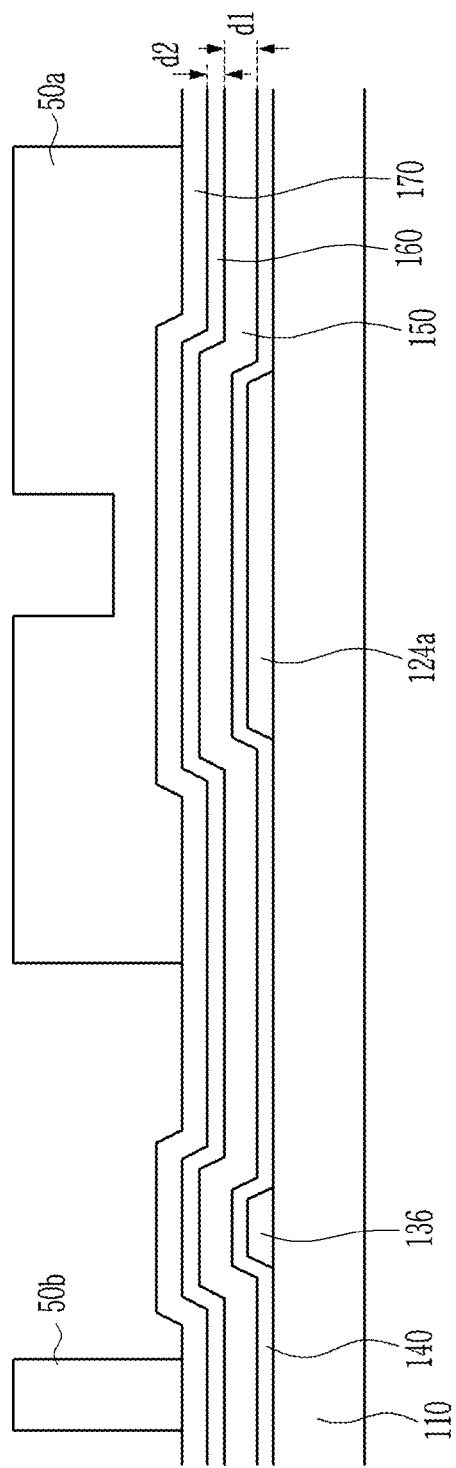

Referring to FIG. 6, a gate insulating layer 140 is formed on the gate line 121 including the first gate electrode 124a and the storage voltage line 131 including the longitudinal part 136. The gate insulating layer 140 may be deposited by, for example, a plasma enhanced chemical vapor deposition (PECVD) method or a reactive sputtering method.

Next, a first silicon layer 150, a second silicon layer 160, and a metal layer 170 are deposited on the gate insulating layer 140.

The first silicon layer 150 may not include an impurity, and the second silicon layer 160 may be doped with a conductive impurity. In this case, the first silicon layer 150 is deposited with a first thickness d1, and the first thickness d1 may be between 800 Å and 900 Å, however the present disclosure is not limited thereto. The second silicon layer 160 is deposited with a second thickness d2, and the second thickness d2 may be greater than 0 Å and equal to or less than 150 Å, however the present disclosure is not limited thereto.

After depositing the gate insulating layer 140, the first silicon layer 150, and the second silicon layer 160, each of photosensitive film patterns 50a and 50b is formed at a position corresponding to a desirable pattern of a semiconductor layer (151 and 154) and a data conductor (171, 173c, 175a, 175b, and 175c). The photosensitive film patterns 50a and 50b are formed by depositing and patterning a photosensitive film (a photoresist, not shown).

The photosensitive film patterns 50a and 50b are disposed at positions where the semiconductor layer (151 and 154), the ohmic contact layers 161 and 164, the data line 171, the source electrode 173a, and the drain electrode 175a are to be formed. In FIG. 6, the photosensitive film pattern 50a is disposed in a region where the first switching element Qa is formed, and a part of the photosensitive film pattern 50a where the channel of the first switching element Qa is formed on the first gate electrode 124a is thinner than other parts. The photosensitive film pattern 50b is disposed at a position where the data line 171 is to be formed.

Figure 7:
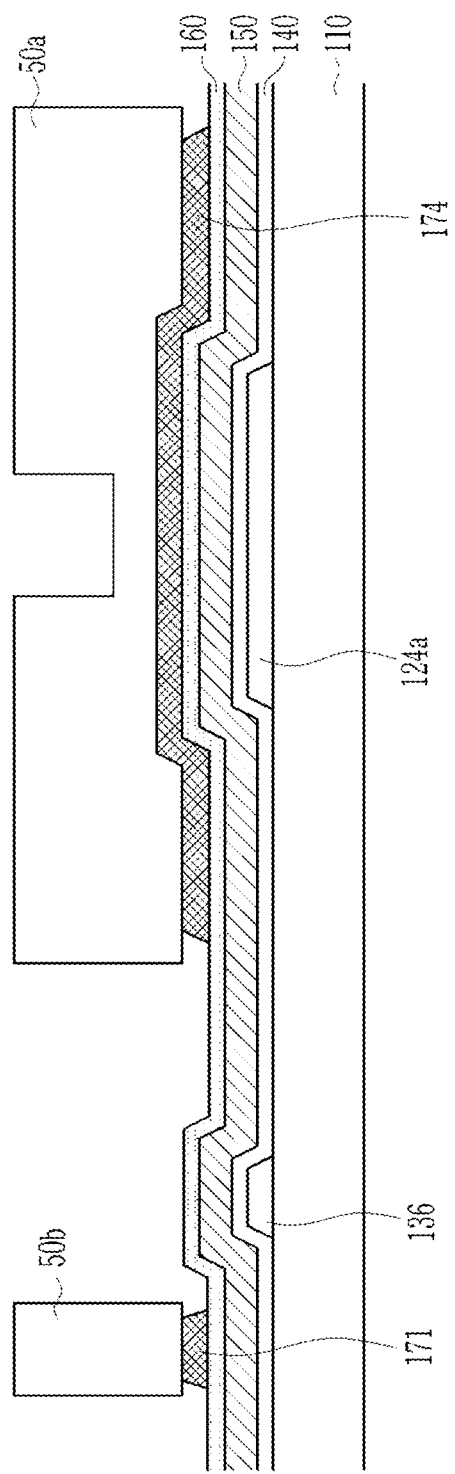

Next, as shown in FIG. 7, the metal layer 170 is etched by using the photosensitive film patterns 50a and 50b as a mask to form the data line 171 and the data metal layer 174 of the first switching element Qa, and portions of the second silicon layer 160 is exposed. The metal layer 170 may be etched by wet etching or dry etching. When the metal layer 170 is etched by wet etching, the width of the data line 171 and the data metal layer 174 may be formed to be smaller than the width of the photosensitive film patterns 50a and 50b due to an isotropic etching characteristic of the wet etching.

Figure 8:
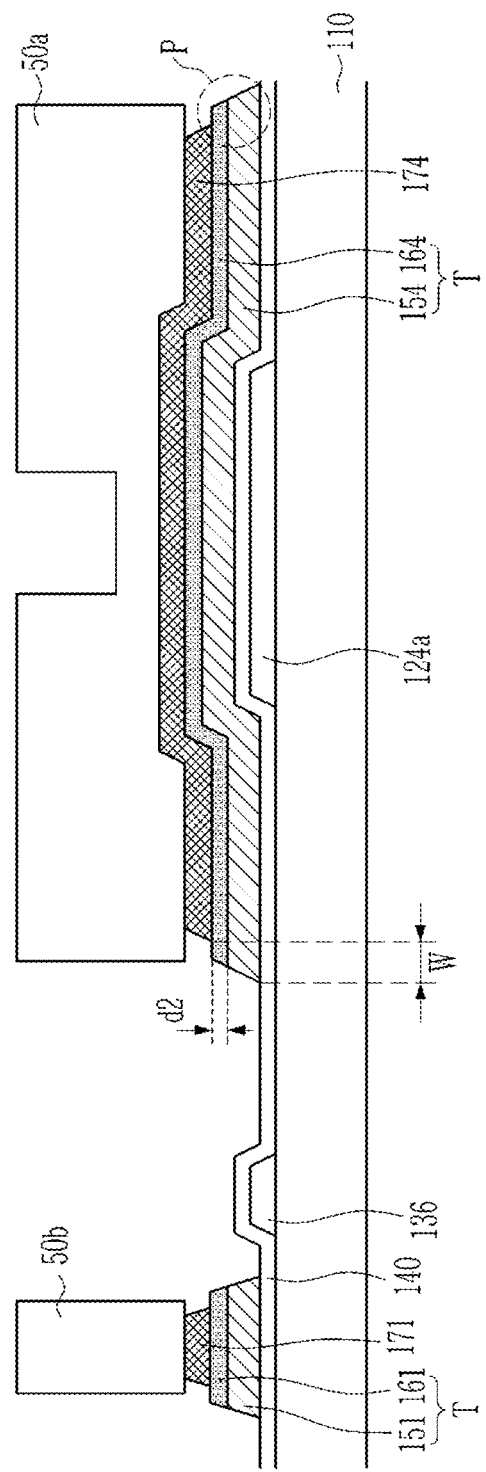

Next, referring to FIG. 8, the first silicon layer 150 and the second silicon layer 160 are etched by using the photosensitive film patterns 50a and 50b as a mask. For example, the first silicon layer 150 and the second silicon layer 160 may be etched by dry etching. As a result, an ohmic contact layer 161 (also referred to as a linear ohmic contact layer) and a semiconductor layer 151 (also referred to as a linear semiconductor layer) are formed under the data line 171, and an ohmic contact layer 164 and a semiconductor layer 154 are formed under the data metal layer 174. Hereinafter, the patterns of the ohmic contact layer 161 and the semiconductor layer 151, and the ohmic contact layer 164 and the semiconductor layer 154, are respectively referred to as the semiconductor pattern T.

According to one embodiment, the first silicon layer 150 and the second silicon layer 160 are etched by dry etching. In this case, the width of the semiconductor pattern T may be formed to be similar to the width of the photosensitive film patterns 50a and 50b due to a unidirectional etching characteristic of the dry etching. Therefore, the semiconductor pattern T may be formed to be protruded with a width greater than that of the data line 171 or the data metal layer 174, and this part is referred to as a protruded part P having a width w as indicated in FIG. 8.

The protruded part P of the semiconductor pattern T may be exposed by an external light supplied from an external light source (e.g., a backlight unit). Particularly, when the semiconductor layer (151 and 154) is made of amorphous silicon (a-Si), the semiconductor layer (151 and 154) may exhibit electrical conductivity depending on the intensity of the external light. This may result in a waterfall defect where the capacitance is varied and a screen is shown as partially bright and dark.

According to an exemplary embodiment, as the width w of the protruded part P of the semiconductor pattern T is reduced, a defect such as the waterfall phenomenon may be avoided by preventing the semiconductor pattern T from being exposed to the external light. An effect of improving the waterfall phenomenon is described in detail with reference to FIG. 15.

The semiconductor pattern T except for the protruded part P may have substantially the same plane shape as the data line 171 and the data metal layer 174. This is because the metal layer 170, the second silicon layer 160, and the first silicon layer 150 are etched by using the photosensitive film patterns 50a and 50b as the same mask.

Figure 9:
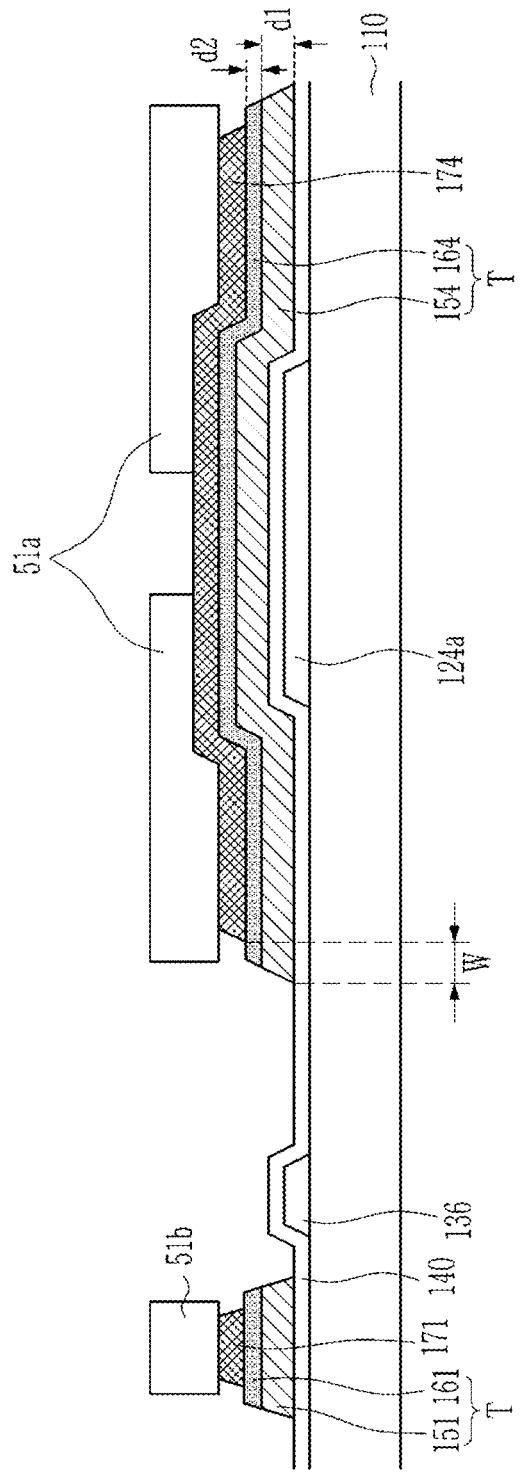

Next, referring to FIG. 9, a part in which the thickness of the photosensitive film patterns 50a and 50b is thin is etched by an etch-back process to expose the data metal layer 174 on the channel region. Simultaneously, the remaining part in which the thickness of the photosensitive film patterns 50a and 50b is thick is partially etched such that the entire height of the photosensitive film patterns 50a and 50b is reduced. Thereafter, the residual photosensitive film patterns 50a and 50b that may remain on a surface of the data metal layer 174 on the channel region are removed by ashing, and photosensitive film patterns 51a and 51b are formed. According to an exemplary embodiment, the etch-back process may be performed before forming the semiconductor pattern T of FIG. 8.

The width w of the protruded part P of the semiconductor pattern T may be greater than 0 μm and equal to or less than 1.3 μm. The width w of the protruded part P may vary based on an order of the etch-back process described in FIG. 9 among four mask processes for manufacturing the display device. However, the present disclosure is not limited to this, and other process modifications may result in a width w of the protruded part P being greater than 0 μm and equal to or less than 1.3 μm.

Figure 10:
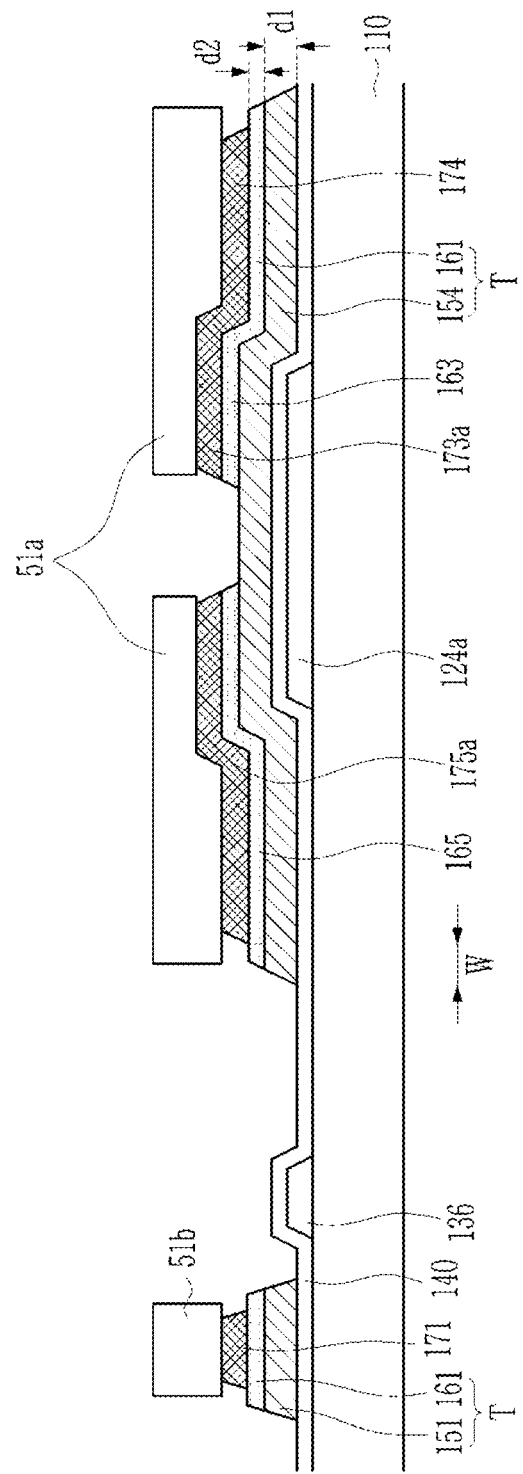

Next, referring to FIG. 10, portions of the data metal layer 174 and the ohmic contact layer 164 corresponding to the channel of the first switching element Qa are etched and removed by using the photosensitive film patterns 51a and 51b as a mask. Accordingly, the ohmic contact layer 165, the first source electrode 173a, and the first drain electrode 175a are formed, and the channel region of the semiconductor layer 154 is exposed. The ohmic contact layer 161 may include the stepped part 163. The first drain electrode 175a corresponds to the drain region of the semiconductor layer 154, and the first source electrode 173a corresponds to the source region of the semiconductor layer 154. The first source electrode 173a may correspond to a part extending from the data line 171.

In this case, the data metal layer 174 and the ohmic contact layer 164 of FIG. 9 may be wet-etched by using an etchant that may etch both the data metal layer 174 and the ohmic contact layer 164. When applying such wet etching, it may be advantageous in that the semiconductor layer 154 may not be damaged by dry etching.

FIG. 10 shows that the ohmic contact layer 164 of FIG. 9 is entirely etched by the second thickness d2 in the channel region. However, according to an exemplary embodiment, a part of the ohmic contact layer 164 of FIG. 9 may not be entirely etched and remain. In this case, the thickness of the ohmic contact layer 164 that is etched for forming the channel region may be greater than 0 Å and equal to or less than 200 Å. In addition, according to an exemplary embodiment, as shown in FIG. 11, a part of the semiconductor layer 154 may be etched along with the etching of the data metal layer 174 and the ohmic contact layer 164.

Figure 11:
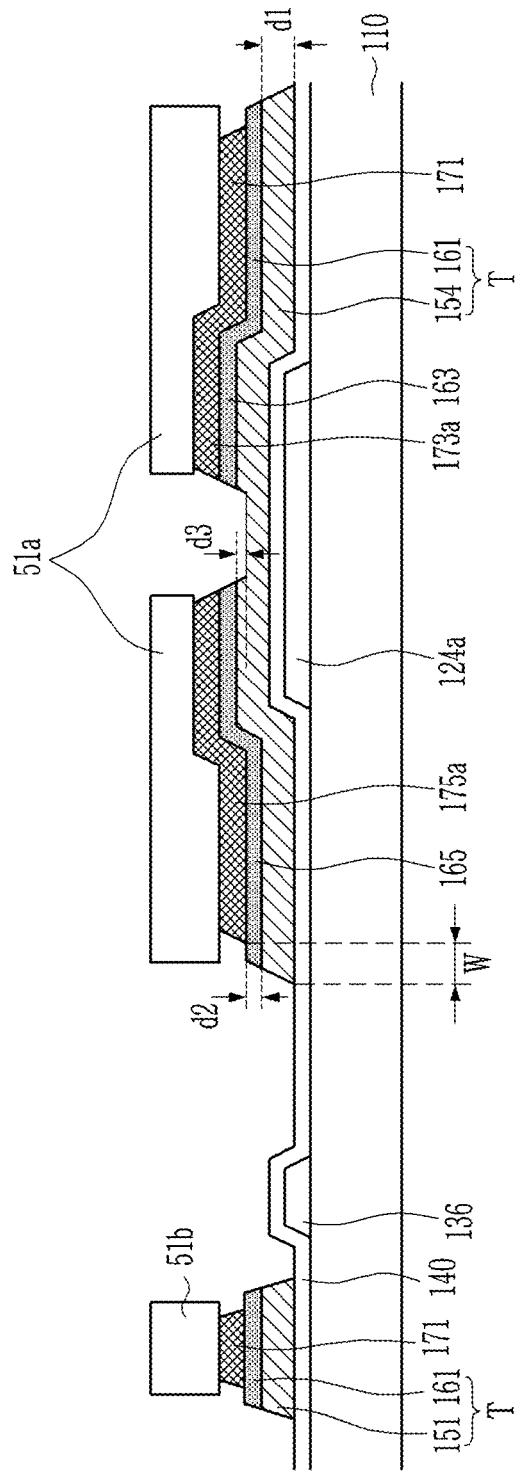

Referring to FIG. 11, a part of the semiconductor layer 154 is dry-etched to form the channel of the first switching element Qa. The third thickness d3 of the semiconductor layer 154 that is dry-etched may be greater than 0 Å and equal to or less than 50 Å. The third thickness d3 may be referred to as a height difference between an upper surface in the source region (or the drain region) of the semiconductor layer 154 and an upper surface in the channel region of the semiconductor layer 154. The height difference between the upper surface in the source region (or the drain region) and the upper surface in the channel region is greater than 0 Å and equal to or less than 50 Å. In this case, the cross-section of the semiconductor layer 154 in the channel region appears to be formed almost flat.

As described above, according to the manufacturing method of the liquid crystal display according to an exemplary embodiment, the step of the semiconductor layer 154 may be minimized by minimizing the etching of the semiconductor layer 154 for forming the channel region, and the cross-section of the semiconductor layer 154 in the channel region is formed to be substantially flat, therefore defects of the display quality that may be caused due to the channel step can be prevented.

In this case, the first thickness d1 that corresponds to an unetched portion of the semiconductor layer 154 may be between 800 Å and 900 Å as described in FIGS. 6 and 11, however the range of the first thickness d1 is not limited thereto. As an example, when the first thickness d1 is 850 Å and the third thickness d3 that corresponds to the thickness of the semiconductor layer 154 that is etched by the dry etching is 50 Å, the thickness (d1−d3) of the remaining portion of the semiconductor layer 154 after being etched may be about 800 Å. In addition, since the second thickness d2 that corresponds to the thickness of the ohmic contact layer 164 of FIG. 9 is greater than 0 Å and equal to or less than 200 Å, the sum (d2+d3) of the second thickness d2 of the etched ohmic contact layer 164 and the third thickness d3 of the etched semiconductor layer 154 may be greater than 0 Å and equal to or less than 250 Å, for example, greater than 0 Å and equal to or less than 200 Å.

According to the exemplary embodiment in FIG. 10, when a part of the ohmic contact layer 164 of FIG. 9 is not etched and remains, the remaining part of the ohmic contact layer 164 may be dry-etched along with the semiconductor layer 154 in the step described with respect to FIG. 11.

An etching gas of chlorine (Cl) series may not be used (or excluded) during the dry etching of the semiconductor layer 154. That is, the etching gas used during the dry etching of the semiconductor layer 154 may not include chlorine (Cl). When the etching gas during the dry etching of the semiconductor layer 154 includes chlorine (Cl), a chlorine (Cl) atom penetrates into the semiconductor layer 154 that contains silicon and acts as an electron donor, so a new energy state of electrons may be formed in the channel region of the semiconductor layer 154. As a result, a flow of electrons in the channel region may become unstable, and a leakage current may occur.

When the leakage current flows, the data signal to be applied to another pixel may be applied to the pixel through a switching element that is turned off but behaves as if it is turned on due to the leakage current. Then, the color of the pixel connected to the turned-off switching element is distorted by the leakage current, resulting in a washed-out color defect that appears to be missing color. In other words, the leakage current may cause the washed-out color defect in which a color represented by an input image signal is distorted into another color over time.

In recent years, there has been a problem that it becomes more difficult to control such washed-out color defects by increasing an area of the display panel as demands for large sized display panel increase. Thus, according to the manufacturing method of the liquid crystal display according to an exemplary embodiment, by using the etching gas without chlorine (Cl) during the dry etching of the semiconductor layer 154, the penetration of chlorine (Cl) into the channel may be prevented, thereby preventing the leakage current. Accordingly, occurrence of the washed-out color defect may be reduced or prevented, and the display quality of the liquid crystal display may be improved.

Next, a third mask process is described with reference to FIG. 12.

Figure 12:
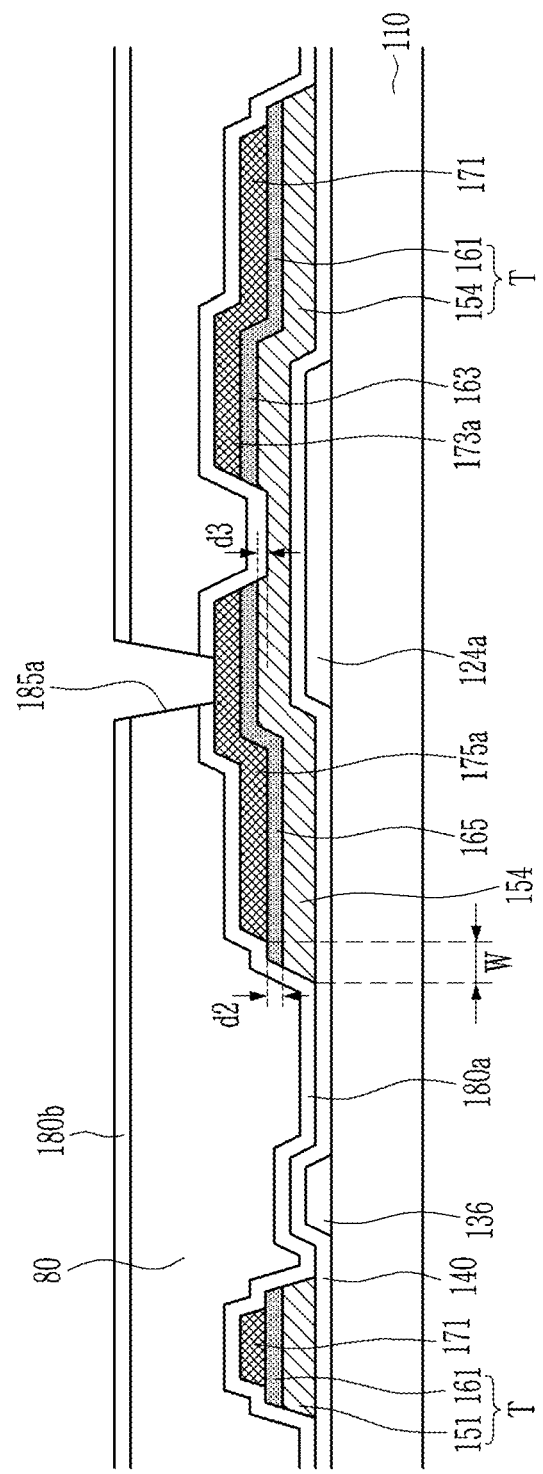

Referring to FIG. 12, the photosensitive film patterns 51a and 51b of FIG. 11 are removed, and a first passivation layer 180a, an organic layer 80, and a second passivation layer 180b are stacked. The first passivation layer 180a and the second passivation layer 180b may include an organic material or an inorganic material, and the organic layer 80 may be the color filter. The second passivation layer 180b, the organic layer 80, and the first passivation layer 180a may be etched by using a photosensitive film pattern (not shown) as a mask to form the first contact hole 185a that exposes a part of the first drain electrode 175a.

Next, a fourth mask process is described with reference to FIG. 13.

Figure 13:
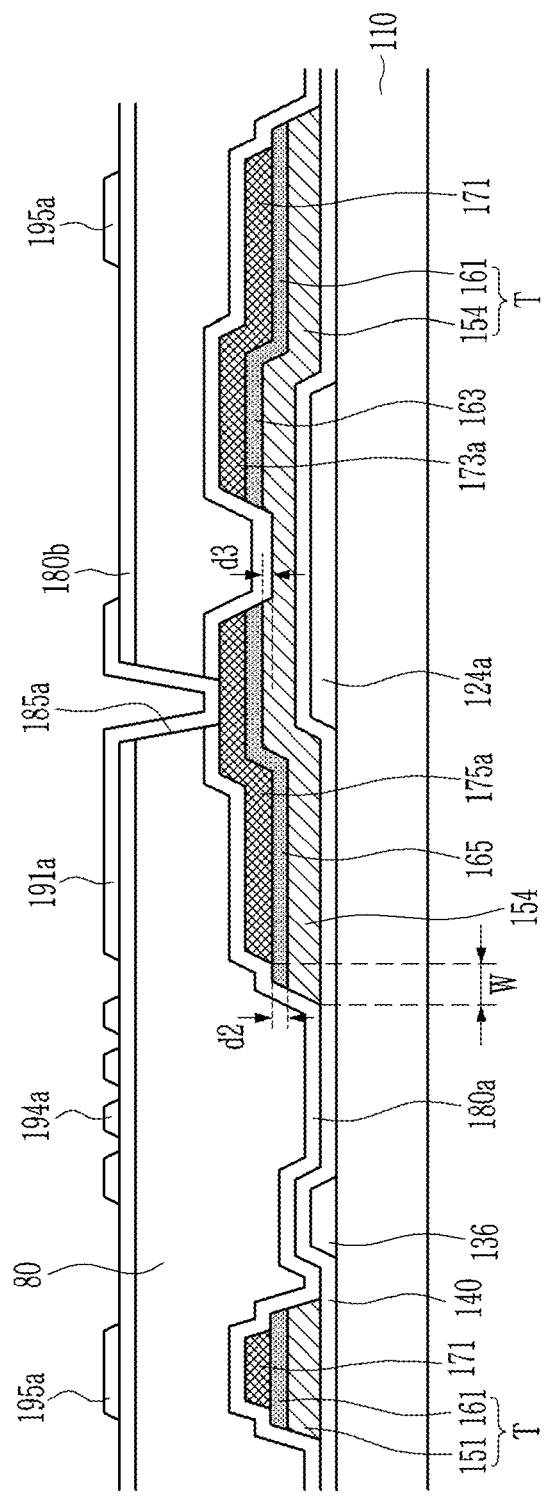

Referring to FIG. 13, a transparent conductor such as ITO or IZO is stacked on the second passivation layer 180b and etched by using a photosensitive film pattern (not shown) as a mask to form a pixel electrode 191 and a shielding electrode 195. The pixel electrode 191 may be electrically connected to the first drain electrode 175a through the first contact hole 185a. The shielding electrode 195 may be applied with the same voltage as a common electrode 270. FIG. 13 shows the shielding electrode 195 including the longitudinal part 195a and the first sub-pixel electrode 191a including the minute stems 194a.

As described above, in the four-mask processes for manufacturing the liquid crystal display, the data conductor (171, 173c, 175a, 175b, and 175c), the ohmic contact layers 161 and 165, and the semiconductor layer (151 and 154) are simultaneously formed by using a single mask. Accordingly, except for the protruded part P of the semiconductor pattern T described in FIG. 10 and FIG. 11, the data conductor (171, 173c, 175a, 175b, and 175c) the ohmic contact layers 161 and 165, and the semiconductor layer (151 and 154) may have substantially the same plane pattern.

Referring back to FIG. 3, a common electrode 270 is formed on an upper substrate 210, and an upper alignment layer (not shown) is formed on the common electrode 270 to form the upper panel 200. Liquid crystal molecules 31 are injected between the upper panel 200 and the lower panel 100 to form a liquid crystal layer 3.

Figure 14:
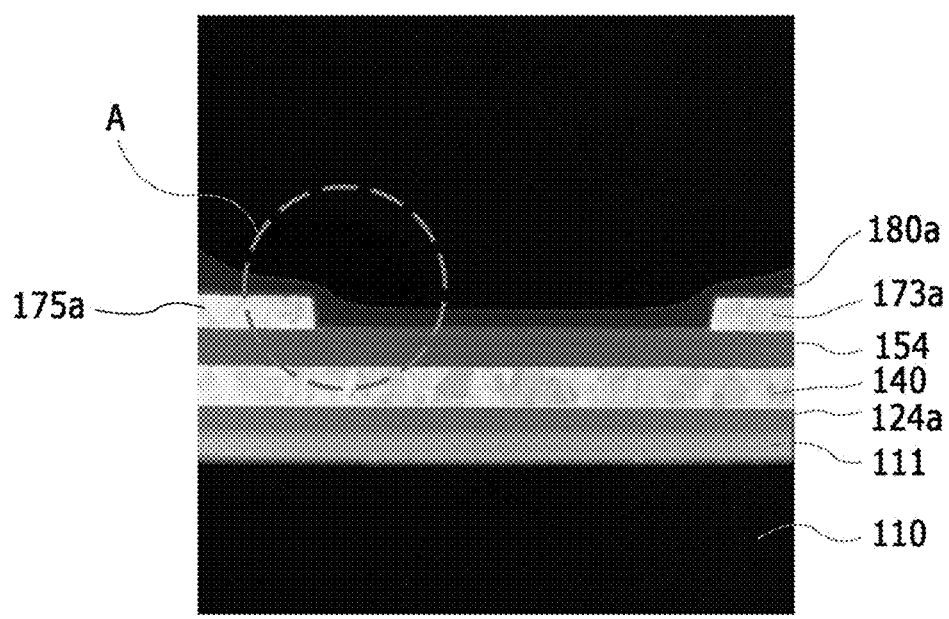
FIG. 14 is a photographic image of a cross-section of a liquid crystal display according to an exemplary embodiment.
Figure 15:
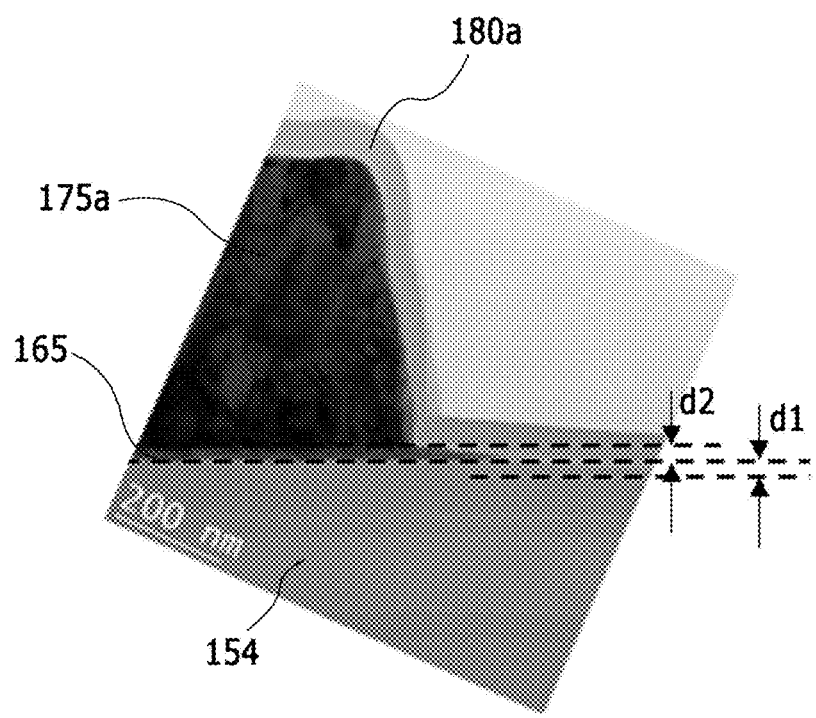
FIG. 15 is an enlarged photographic image of a part of FIG. 14.

A partial cross-sectional shape of the liquid crystal display according to an exemplary embodiment will be described in detail with reference to FIG. 14 and FIG. 15. FIG. 14 is a photographic image of a cross-section of a liquid crystal display according to an exemplary embodiment, and FIG. 15 is a partially enlarged photographic image of FIG. 14. In the following, the description of the same constituent elements as those described above may be omitted, and only the added or characteristic portions will be described.

Referring to FIG. 14, a buffer layer 111 may be disposed on the lower substrate 110.

The buffer layer 111 may include an inorganic insulating material or an organic insulating material. The buffer layer 111 may prevent impurities from flowing into a thin film transistor while planarizing the lower substrate 110. The buffer layer 111 may be omitted according to an exemplary embodiment.

A first gate electrode 124a is disposed on the buffer layer 111 and a gate insulating layer 140 is disposed thereon. A semiconductor layer 154 is disposed on the gate insulating layer 140, a first source electrode 173a and a first drain electrode 175a are disposed thereon, and a first passivation layer 180a is disposed thereon. In FIG. 14, the semiconductor layer 154 and the ohmic contact layer 165 disposed thereon are not clearly distinguished, so the ohmic contact layer 165 is not explicitly indicated as a separate layer for the convenience of illustration.

The semiconductor layer 154 includes a source region and a drain region that are doped with an impurity, and a channel region disposed between the source region and the drain region without doping with the impurity. The source region and the drain region may respectively correspond to the first source electrode 173a and the first drain electrode 175a.

Referring to FIG. 14, it may be seen that the semiconductor layer 154 is formed to be substantially flat without a step (or a small step) in the channel region. This is because the ohmic contact layer 165 (not shown) and the semiconductor layer 154 are minimally etched when forming the channel region such that a deviation of the thickness of the semiconductor layer 154 in the channel region may be minimized.

Particularly, the thickness of the etched part of the semiconductor layer 154 is greater than 0 Å and equal to or less than 50 Å.

In this case, the ohmic contact layer 165 and the semiconductor layer 154 may be etched by dry etching, and the etching gas used does not include chlorine (Cl).

FIG. 15 shows an enlarged view of the part A in which the ohmic contact layer 165 is disposed between the first drain electrode 175a and the semiconductor layer 154.

The ohmic contact layer 165 is disposed on the semiconductor layer 154, and the first drain electrode 175a and the first passivation layer 180a are sequentially disposed thereon. The second thickness d2 corresponding to the thickness of the ohmic contact layer 165 may be greater than 0 Å and equal to or less than 150 Å.

In the channel region of the semiconductor layer 154, the ohmic contact layer 165 is etched and removed, and a part of the semiconductor layer 154 may also be etched. According to one embodiment, the ohmic contact layer 165 may be wet-etched, and the semiconductor layer 154 may be dry-etched. If the ohmic contact layer 165 is not entirely removed by the wet etching as described above and partially remains, the remaining part of the ohmic contact layer 165 may be etched by the dry etching along with the semiconductor layer 154.

Since the second thickness d2 is greater than 0 Å and equal to or less than 150 Å, and the third thickness d3 corresponding to the thickness of the etched semiconductor layer 154 is greater than 0 Å and equal to or less than 50 Å, the sum of the second thickness d2 of the ohmic contact layer 165 that is etched for forming the channel and the third thickness d3 of the etched semiconductor layer 154 is greater than 0 Å and equal to or less than 200 Å. The step of the semiconductor layer 154 that may be formed in the channel region may be minimized by minimizing the thickness of the etched semiconductor layer 154 to less than 50 Å. As a result, a leakage current and a defect that may be caused by the channel step may be prevented, thereby improving the display quality of the display device.

Figure 16:
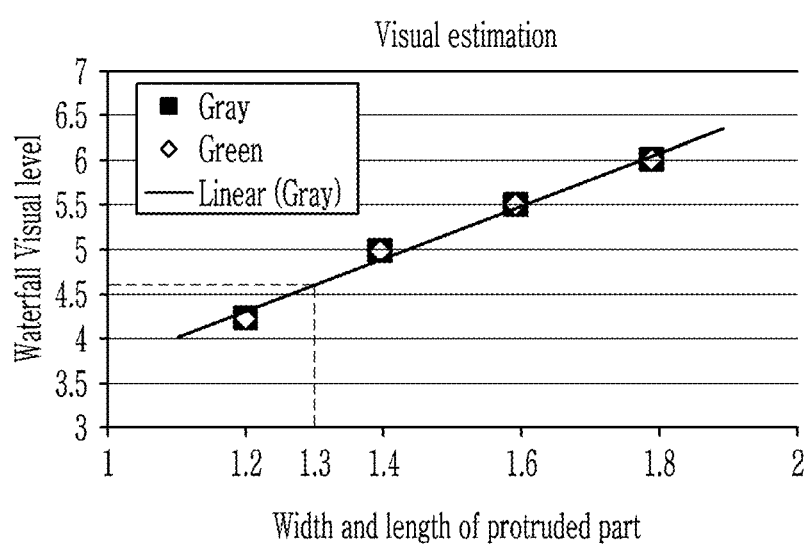
FIG. 16 is a graph showing a visual level of a waterfall depending on a width of a protruded part of a semiconductor pattern.
Figure 17:
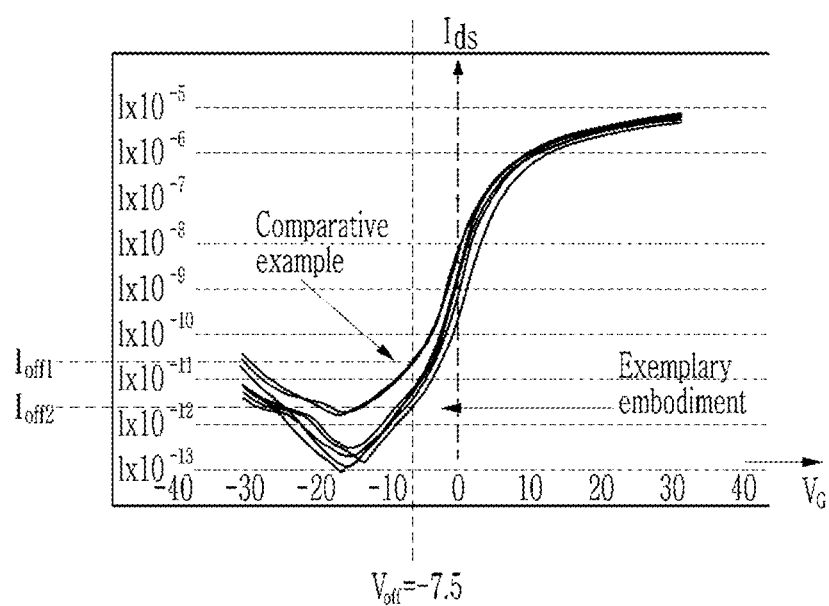
FIG. 17 is a graph showing a reduction of a leakage current in a liquid crystal display according to an exemplary embodiment.
Figure 18:
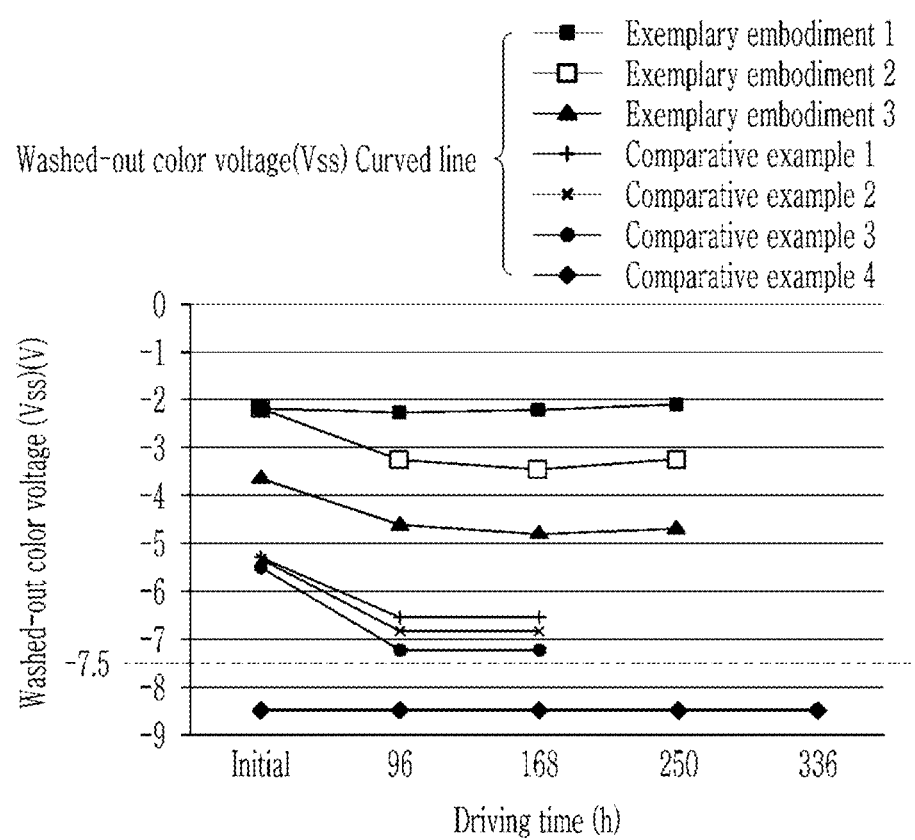
FIG. 18 is a graph showing an improvement of a washed-out color voltage Vss in a liquid crystal display according to an exemplary embodiment.

Next, the improved display quality of the liquid crystal display according to an exemplary embodiment is described with reference to FIG. 16 to FIG. 18. FIG. 16 is a graph showing a visual level of a waterfall depending on a width of a protruded part of a semiconductor pattern, FIG. 17 is a graph showing a reduction of a leakage current in a liquid crystal display according to an exemplary embodiment, and FIG. 18 is a graph showing an improvement of a washed-out color voltage Vss in a liquid crystal display according to an exemplary embodiment. In the following, description of the same constituent elements as those described above may be omitted, and only the added or characteristic portions will be described.

Referring to FIG. 16, the horizontal axis represents a width w (μm) of the protruded part P of the semiconductor pattern T shown in FIG. 3, and the vertical axis represents a level at which a waterfall phenomenon is recognized by eyes as a visual level. As an example, when the width w of the protruded part P is 1.8 μm, the visual level of the waterfall phenomenon is recognized at about 6, and when the width w is reduced to 1.5 μm, the visual level of the waterfall phenomenon is reduced to about 5.2.

According to an exemplary embodiment, since the width w of the protruded part P of the semiconductor pattern T is greater than 0 μm and equal to or less than 1.3 μm, the visual level of the waterfall phenomenon is reduced to about 4.6 or less as indicated by the dotted line. That is, as the width w of the protruded part P of the semiconductor pattern T is reduced, the waterfall defect is reduced by 2 levels or more, thereby improving the display quality.

Referring to FIG. 17, the horizontal axis represents the voltage ($V_G$) of a gate electrode of a thin film transistor, and the vertical axis represents a drain-source current (Ids) flowing between a drain electrode and a source electrode of the thin film transistor. Curves of exemplary embodiments are obtained by using the etching gas without chlorine (Cl) in the dry etching process of the semiconductor layer as described above, and curves of comparative examples are obtained using the etching gas including chlorine (Cl) in the dry etching process of the semiconductor layer.

FIG. 17 shows that the curves of the exemplary embodiments are shifted in a negative direction and further downward compared the curves of the comparative examples. A gate-off voltage Voff of −7.5 V is used as an example in the present exemplary embodiment as indicated by the dotted line. The gate-off voltage Voff is not limited thereto, and may be other values depending on the characteristics of the thin film transistor. The gate-off voltage Voff refers to a voltage required to change on/off state of the thin film transistor.

Hereinafter, the current flowing in the gate-off voltage Voff is referred to as a leakage current (Ioff1 and Ioff2). When the gate-off voltage Voff is −7.5 V, the leakage current (Ioff2) of the exemplary embodiments is smaller than the leakage current (Ioff1) of the comparative examples. That is, as the leakage current is reduced by using the etching gas without chlorine (Cl) in the dry etching process of the semiconductor layer 154. The reduced leakage current may prevent defects such as a washed-out color, thereby improving the display quality.

Referring to FIG. 18, the horizontal axis is a driving time (h) of the liquid crystal display, and the vertical axis is a washed-out color voltage Vss causing a washed-out color defect. The curves of the washed-out color voltage Vss according to Exemplary Embodiment 1 to Exemplary Embodiment 3 and Comparative Example 1 to Comparative Example 3 are shown sequentially from the above. In the following description, for the convenience of description, the gate-off voltage Voff described in FIG. 17 is described as a reference voltage Voff.

If the washed-out color voltage Vss is smaller than the reference voltage Voff, the washed-out color defect may occur, and if it is greater than the reference voltage Voff, the washed-out color defect may not occur. In the present exemplary embodiment, the reference voltage Voff is set as −7.5 V and is indicated by the dotted line in FIG. 18.

The washed-out color defect may occur as the characteristic of the thin film transistor is shifted to a negative side over time, and accordingly the curve of the washed-out color voltage Vss gets closer to the reference voltage Voff. As the driving time progresses, the curves of the washed-out color voltage Vss according to the comparative examples and the exemplary examples do not further decrease after some time At this time, a difference between a saturated value of the curve of the washed-out color voltage Vss and the reference voltage is referred to as a washed-out color margin. When the curve of the washed-out color voltage Vss is above the reference washed-out color voltage, in other words, closer to zero, the washed-out color margin is large, and the stability from the washed-out color defect may be secured. As the difference between the curve of the washed-out color voltage Vss and the reference voltage becomes greater, the washed-out color margin increases, and it is advantageous to prevent or reduce the occurrence of the washed-out color defect.

FIG. 18 shows that the curve of the washed-out color voltage Vss of the exemplary embodiments is above the washed-out color voltage Vss of the comparative examples.

In Comparative Example 4, the washed-out color voltage Vss already has a negative value smaller than the reference voltage Voff such that the washed-out color defect may occur. The curves of Comparative Example 1 to Comparative Example 3 are disposed above the reference voltage Voff, however they are close to the reference voltage Voff such that the washed-out color margin is small.

Particularly, in Comparative Example 3, the reference voltage Voff is −7.5 V, and the washed-out color margin is less than 0.5 V. In this case, if the driving time gets longer, the washed-out color defect is likely to be visible. In addition, in Comparative Embodiment 1, the washed-out color margin is about 1 V, and it may not be safe from occurrence of the washed-out color defect because the washed-out color margin is still small.

In contrast, the curved of Exemplary Embodiment 1 to Exemplary Embodiment 3 are above the curves of Comparative Example 1 to Comparative Example 3 from the reference voltage Voff such that the washed-out color margin is greater than that of the comparative examples.

Particularly, in Exemplary Embodiment 1, the washed-out color voltage Vss is about −2 V, and the reference voltage Voff −7.5 V, so that the washed-out color margin of about 5.5 V is secured. In Exemplary Embodiment 2, the washed-out color voltage Vss is about −3.5 to −2 V, and the washed-out color margin of about 4 V is secured. In Exemplary Embodiment 3, the washed-out color voltage Vss is about −5 to −3.5 V, and the washed-out color margin of about 2.5 V is secured.

As such, the exemplary embodiments of the present disclosure may secure the washed-out color margin of at least 11 times greater compared with the comparative examples so that the stability from the washed-out color defect may be secured, and the display quality may be improved.

While the present disclosure has been described in connection with what is presently considered to be practical exemplary embodiments, it is to be understood that the present disclosure is not limited to the disclosed exemplary embodiments, but, on the contrary, is intended to cover various modifications and equivalent arrangements included within the spirit and scope of the present disclosure.

<Description of symbols>

| | |
|---|---|
| PX: pixel | PXa, PXb: sub-pixel |
| GL, 121: gate line | DL, 171: data line |
| RL, 172: reference voltage line | |
| 131: storage voltage line | 131a, 131b: storage electrode |
| Clca, Clcb: liquid crystal capacitor | Csta, Cstb: storage capacitor |
| Qa, Qb, Qc: switching element (thin film transistor) | |
| 110, 210: substrate | 124a, 124b, 124c: gate electrode |
| 140: gate insulating layer | 151,154: semiconductor layer |
| 154a, 154b, 154c: semiconductor | 161,164,165: ohmic contact layer |
| 173a, 173b, 173c: source electrode | 175a, 175b, 175c: drain electrode |
| 180a, 180b: passivation layer | 191a, 191b: sub-pixel electrode |
| 50a, 50b, 51a, 51b: photosensitive film pattern | |

What is claimed is:
1. A liquid crystal display comprising:
   a gate line connected to a gate electrode;
   a semiconductor layer disposed on the gate line and including silicon;
   an ohmic contact layer disposed on the semiconductor layer; and
   a data conductor disposed on the ohmic contact layer,
   wherein the semiconductor layer includes a source region, a drain region, and a channel region that is disposed between the source region and the drain region,
   wherein the data conductor includes a data line transmitting a data signal, a source electrode corresponding to the source region, and a drain electrode corresponding to the drain region, wherein a channel step of the semiconductor layer is greater than 0 Å and equal to or less than 50 Å, wherein the channel step corresponds to a height difference measured in a thickness direction of a liquid crystal display panel between an upper surface in the source region or the drain region and an upper surface in the channel region, and wherein the upper surface in the source region or the drain region has a maximum height of the semiconductor layer.

2. The liquid crystal display of claim 1, wherein the semiconductor layer and the ohmic contact layer include a protruded part that does not overlap the data conductor in a region except for the channel region, and a width of the protruded part is equal to or less than 1.3 μm.

3. The liquid crystal display of claim 1, wherein the semiconductor layer has a thickness in a range of 800 Å to 900 Å.

4. The liquid crystal display of claim 2, wherein the width of the protruded part is in a range of 11.5 to 16.3 times greater than a sum of a thickness of the semiconductor layer and a thickness of the ohmic contact layer.

5. The liquid crystal display of claim 2, wherein the semiconductor layer and the ohmic contact layer have a same plane shape as the data conductor except for the channel region and the protruded part.

6. The liquid crystal display of claim 1, wherein the ohmic contact layer has a thickness greater than 0 Å and equal to or less than 200 Å.

7. The liquid crystal display of claim 3, wherein a ratio of the channel step to the thickness of the semiconductor layer is greater than 0 and equal to or less than 0.056.

8. The liquid crystal display of claim 1, wherein a difference of a washed-out color voltage Vss causing a washed-out color defect and a reference voltage Voff is in a range of 2.5 V to 6V, and the washed-out color defect occurs when the washed-out color voltage is smaller than the reference voltage.

9. The liquid crystal display of claim 1, further comprising:

a first switching element and a second switching element that are connected to the gate line and the data line;

a third switching element connected to the gate line, the second switching element, and a reference voltage line;

a first sub-pixel electrode connected to the first switching element; and a second sub-pixel electrode connected to the second switching element and the third switching element.

10. The liquid crystal display of claim 9, wherein the data line and the reference voltage line are disposed on a same layer.

11. The liquid crystal display of claim 9, wherein a storage voltage line transmitting a predetermined voltage is disposed on a same layer as the gate line, and a first storage electrode overlapping the first sub-pixel electrode and a second storage electrode overlapping the second sub-pixel electrode extend from the storage voltage line.

12. The liquid crystal display of claim 11, wherein the first storage electrode and the second storage electrode overlap a longitudinal stem of the first sub-pixel electrode or a longitudinal stem of the second sub-pixel electrode.

* * * * *